United States Patent
Lin et al.

(10) Patent No.: US 9,984,924 B2
(45) Date of Patent: May 29, 2018

(54) SEMICONDUCTOR DEVICE AND FORMATION THEREOF

(71) Applicant: Taiwan Semiconductor Manufacturing Company Limited, Hsin-Chu (TW)

(72) Inventors: Yu-Hung Lin, Taichung (TW); You-Hua Chou, Hsinchu (TW); Sheng-Hsuan Lin, Zhubei (TW); Chih-Wei Chang, Hsin-Chu (TW)

(73) Assignee: TAIWAN SEMICONDUCTOR MANUFACTURING COMPANY LIMITED, Hsin-Chu (TW)

( * ) Notice: Subject to any disclaimer, the term of this patent is extended or adjusted under 35 U.S.C. 154(b) by 0 days. days.

(21) Appl. No.: 15/381,034

(22) Filed: Dec. 15, 2016

(65) Prior Publication Data

US 2017/0098576 A1    Apr. 6, 2017

Related U.S. Application Data

(62) Division of application No. 14/180,400, filed on Feb. 14, 2014, now Pat. No. 9,530,736.

(51) Int. Cl.
*H01L 23/532* (2006.01)
*H01L 21/768* (2006.01)

(52) U.S. Cl.
CPC .. *H01L 21/76864* (2013.01); *H01L 21/76846* (2013.01); *H01L 21/76847* (2013.01); *H01L 21/76855* (2013.01); *H01L 21/76879* (2013.01); *H01L 23/53261* (2013.01); *H01L 23/53266* (2013.01)

(58) Field of Classification Search
CPC ......... H01L 21/76864; H01L 21/76846; H01L 21/76847; H01L 21/76853; H01L 21/76855; H01L 21/76856; H01L 23/53266; H01L 23/53261
See application file for complete search history.

(56) References Cited

U.S. PATENT DOCUMENTS

| | | | | |
|---|---|---|---|---|
| 6,100,182 A | * | 8/2000 | Lee | H01L 21/28568 257/751 |
| 6,177,338 B1 | * | 1/2001 | Liaw | H01L 21/02129 257/E21.252 |
| 2002/0019127 A1 | * | 2/2002 | Givens | H01L 21/28518 438/637 |
| 2009/0280641 A1 | * | 11/2009 | Kang | H01L 21/28518 438/653 |

* cited by examiner

*Primary Examiner* — Michael Trinh
(74) *Attorney, Agent, or Firm* — Cooper Legal Group, LLC

(57) ABSTRACT

A semiconductor device and method of formation are provided. The semiconductor device comprises a metal plug in a first opening over a substrate, the metal plug is over a silicide layer, and the silicide layer is over a metal oxide layer. The metal oxide layer has an oxygen gradient, such that a percentage of oxygen increases from a top surface of the metal oxide layer to a bottom surface of the metal oxide layer. The metal oxide layer unpins the Fermi level of the interface between the metal plug and the substrate, which is exhibited by a lowered Schottky barrier height (SBH) and increased oxygen vacancy states between the V.B. and the C.B. of the metal oxide layer, which decreases the intrinsic resistivity between the metal plug and the substrate as compared to a semiconductor device that lacks such a metal oxide layer.

20 Claims, 5 Drawing Sheets

SEMICONDUCTOR DEVICE AND FORMATION THEREOF

RELATED APPLICATION

This application is a divisional of and claims priority to U.S. patent application Ser. No. 14/180,400, titled "SEMICONDUCTOR DEVICE AND FORMATION THEREOF" and filed on Feb. 14, 2014, which is incorporated herein by reference. U.S. patent application Ser. No. 14/180,400 is now issued as U.S. Pat. No. 9,530,736

BACKGROUND

Contacts are used to make electrical connections in or among different features in a semiconductor arrangement. A contact, for example, is used to connect one metal layer to another metal layer, where the metal layers are otherwise electrically isolated from one another, such as by an insulating or dielectric material separating the metal layers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
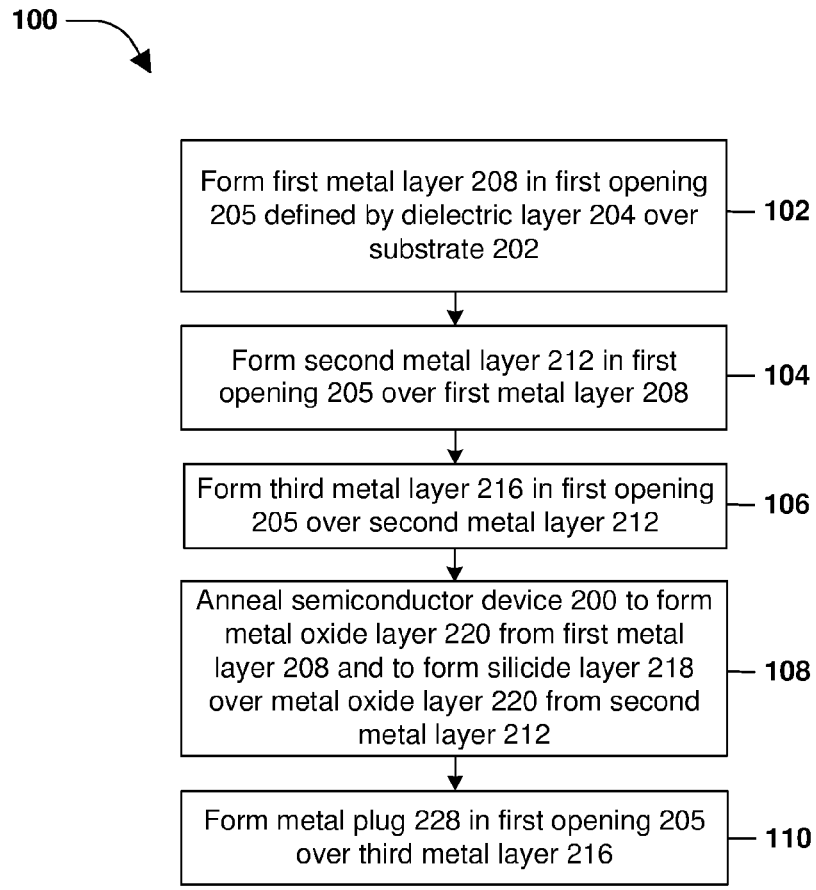
FIG. 1 is a flow diagram illustrating a method of forming a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One or more techniques for forming a semiconductor device and resulting structures formed thereby are provided herein.

Figure 6:
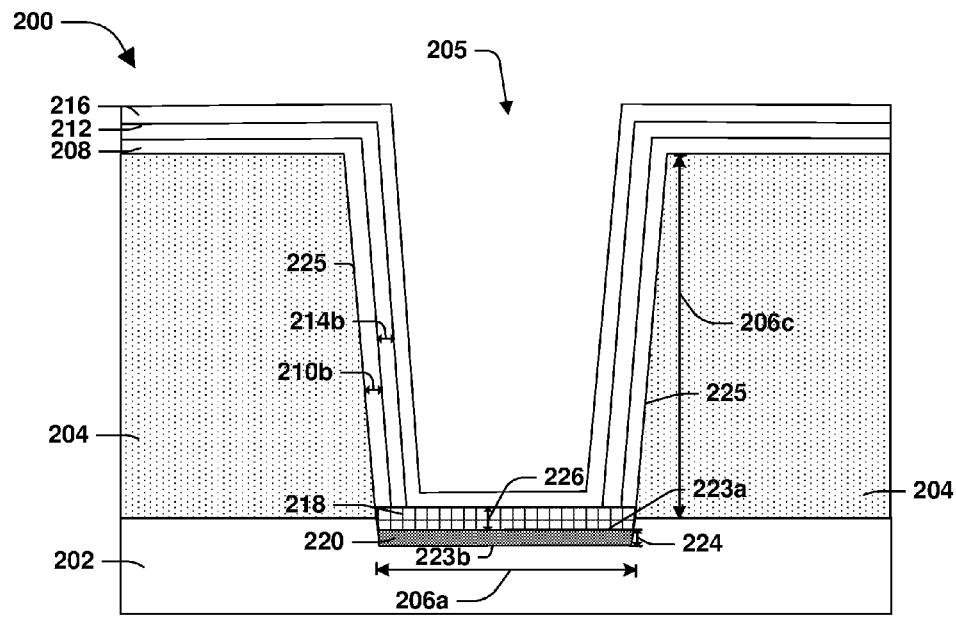
FIG. 6 is an illustration of a semiconductor device, in accordance with some embodiments.
Figure 7:
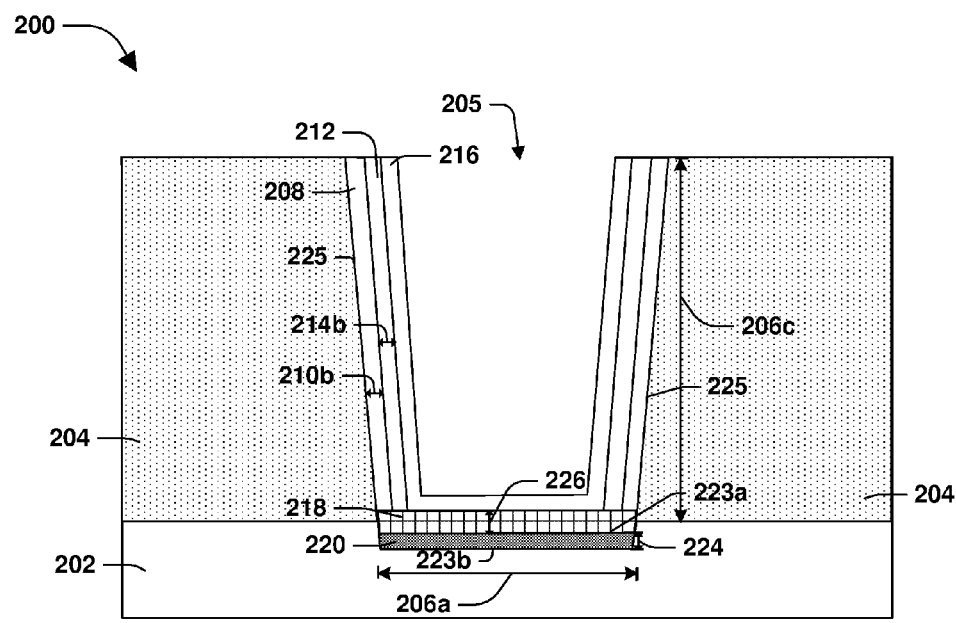
FIG. 7 is an illustration of a semiconductor device, in accordance with some embodiments.
Figure 8:
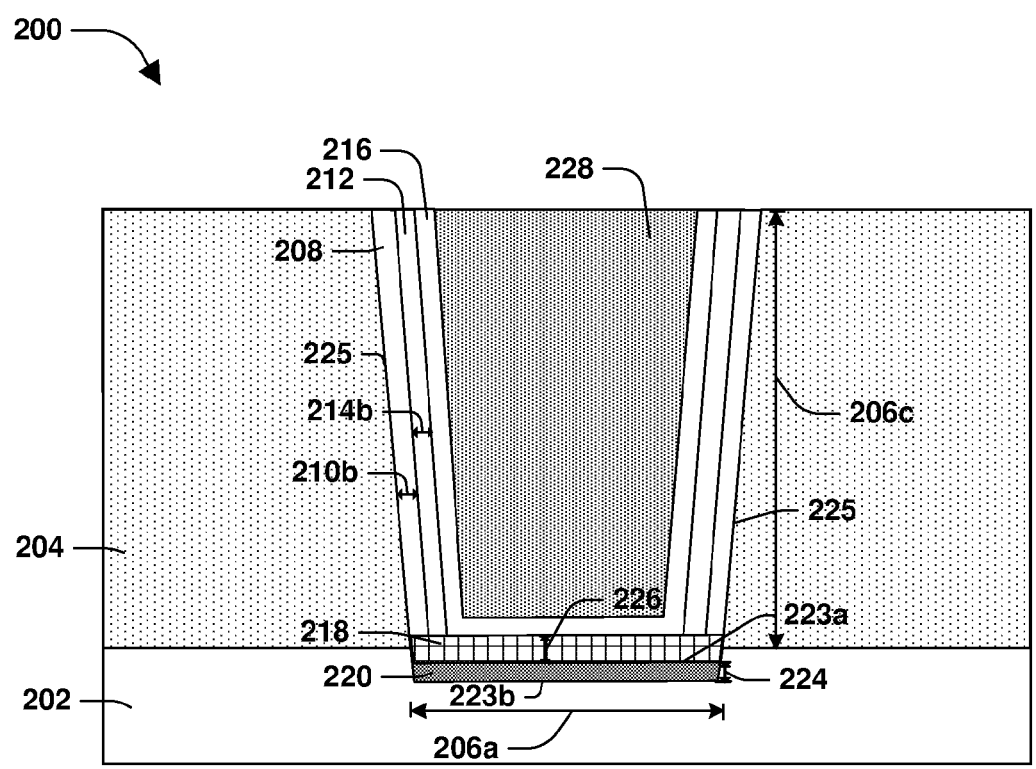
FIG. 8 is an illustration of a semiconductor device, in accordance with some embodiments.

A method 100 of forming a semiconductor device 200 according to some embodiments is illustrated in FIG. 1 and one or more structures formed thereby at various stages of fabrication are illustrated in FIGS. 2-8. According to some embodiments, such as illustrated in FIG. 8, the semiconductor device 200 comprises a metal plug 228 in a first opening 205, illustrated in FIG. 7, defined by a dielectric layer 204 over a substrate 202. In some embodiments, the metal plug 228 is over a silicide layer 218 and a metal oxide layer 220, where the silicide layer 218 is between the metal plug 228 and the metal oxide layer 220. In some embodiments, the metal oxide layer 220 comprises a metal, such as titanium or zinc, and an oxide. In some embodiments, the metal oxide layer 220 comprises an oxygen gradient, such that a percentage of oxygen increases from a top surface 223a of the metal oxide layer 220 to a bottom surface 223b of the metal oxide layer 220. In some embodiments, there is thus relatively more oxygen proximate the bottom surface 223b of the metal oxide layer 220a and relatively less oxygen proximate the top surface 223a of the metal oxide layer. In some embodiments, there is thus relatively more metal proximate the top surface 223a of the metal oxide layer 220 and relatively less metal proximate the bottom surface 223b of the metal oxide layer 220. In some embodiments, a first metal layer 208 is on a sidewall 225 of the first opening 205, illustrated in FIG. 7, defined by the dielectric layer 204. In some embodiments, the first metal layer 208 comprises at least one of zinc, oxide, or titanium. In some embodiments, a second metal layer 212 is on the first metal layer 208. In some embodiments, the second metal layer 212 comprises at least one of titanium, nickel, tungsten, or cobalt. In some embodiments, a third metal layer 216 is between the metal plug 228 and the silicide layer 218, and the metal plug 228 and the second metal layer 212. In some embodiments, a Fermi level of an interface between the metal plug 228 and the substrate 202 is unpinned by the addition of the metal oxide layer 220, which is exhibited by a lowered Schottky barrier height (SBH) as compared to a semiconductor device that lacks a metal oxide layer 220. In some embodiments, the metal oxide layer 220 increases oxygen vacancy states between a valance band (V.B.) and a conduction band (C.B.) of the metal oxide layer 220, which decreases at least one of an intrinsic resistivity or a contact resistance between the metal plug 228 and the substrate 202 as compared to a semiconductor device that lacks a metal oxide layer. In some embodiments, the silicide layer 218 is formed from the second metal layer 212 during or as a result of an annealing process. In some embodiments, the silicide layer 218 formation reduces a strain on a silicon lattice in the substrate 202, as compared to a semiconductor device that does not have such a silicide layer.

Figure 2:
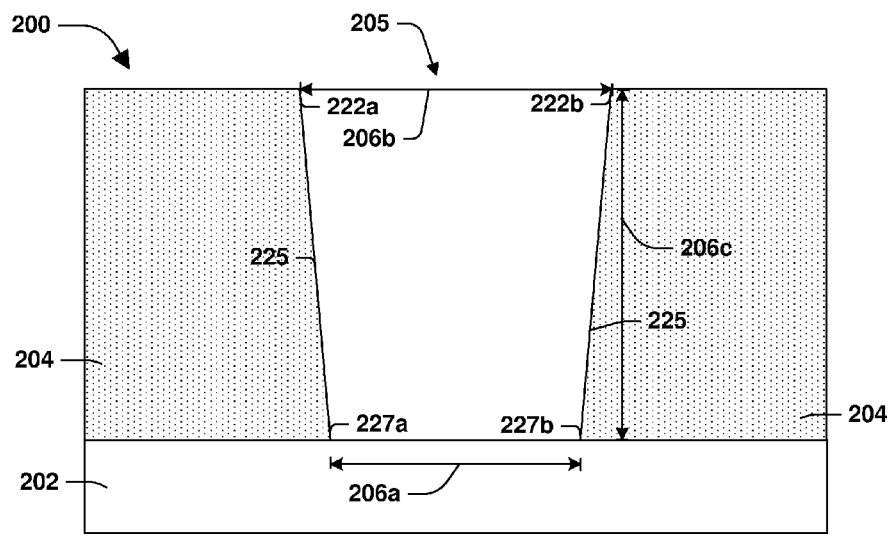
FIG. 2 is an illustration of a semiconductor device, in accordance with some embodiments.
Figure 3:
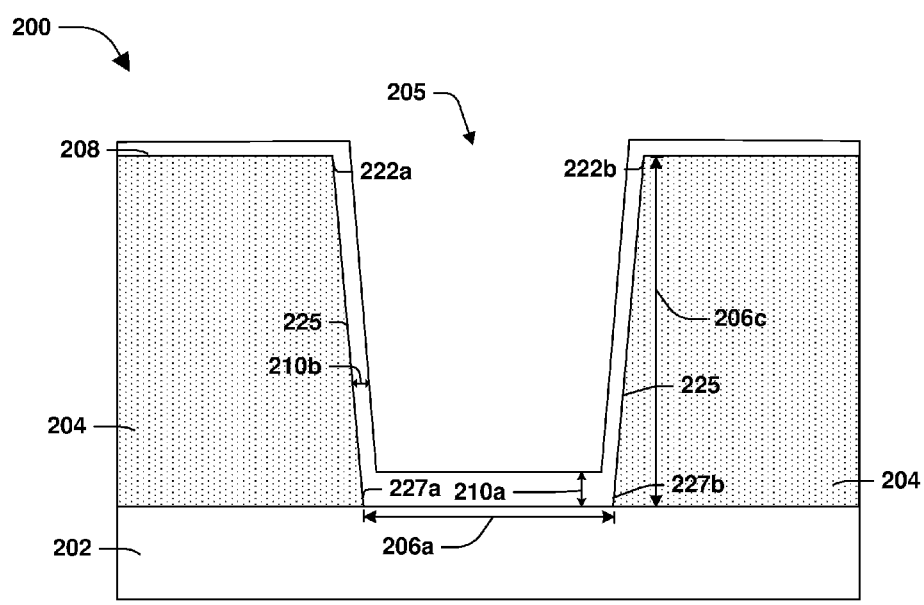
FIG. 3 is an illustration of a semiconductor device, in accordance with some embodiments.

At 102, the first metal layer 208 is formed in the first opening 205 defined by the dielectric layer 204 over the substrate 202, as illustrated in FIG. 3, according to some embodiments. Turning to FIG. 2, prior to FIG. 3, the first opening 205 is formed in the dielectric layer 204 over the substrate 202, according to some embodiments. In some embodiments, the first opening 205 is formed via etching, such as a contact dry etch. In some embodiments, the substrate 202 comprises at least one of silicon or germanium. According to some embodiments, the substrate 202 comprises at least one of an epitaxial layer, a silicon-on-insulator (SOI) structure, a wafer, or a die formed from a wafer. In some embodiments, the substrate 202 comprises at least one CMOS device. In some embodiments, the dielectric layer 204 comprises at least one of a silicon oxide or a silicon nitride. In some embodiments, the first opening 205 has a top width 206b. In some embodiments, the top width 206b is measured from top portions of opposing top sidewalls 222a and 222b of the sidewalls 225 defining the first opening 205 of the dielectric layer 204. In some embodiments, the top width 206b is between 10 µm to about 25 µm. In some embodiments, the first opening 205 has a bottom width 206a. In some embodiments, the bottom width 206a is measured from bottom portions of opposing bottom sidewalls 227a and 227b of the sidewalls 225. In some embodiments, the bottom width 206a is between 5 µm to about 20 µm. In some embodiments, the top width 206b is greater than the bottom width 206a. In some embodiments, the first opening 205 has a first depth 206c as measured from a top surface of the dielectric layer 204 to a top surface of the substrate 202. In some embodiments, the first depth 206c is between 750 Å to about 1,250 Å. Turning to FIG. 3, the first metal layer 208 is formed in the first opening 205, according to some embodiments. In some embodiments, the first metal layer 208 comprises at least one of zinc oxide (ZnO) or titanium oxide (TiO$_2$). In some embodiments, the first metal layer 208 has first bottom thickness 210a between about 5 Å to about 100 Å. In some embodiments, the first metal layer 208 has a first sidewall thickness 210b between about 2 Å to about 75 Å. In some embodiments, the first bottom thickness 210a is greater than the first sidewall thickness 210b. In some embodiments, the first metal layer 208 is formed using at least one of physical vapor deposition (PVD) or atomic layer deposition (ALD).

Figure 4:
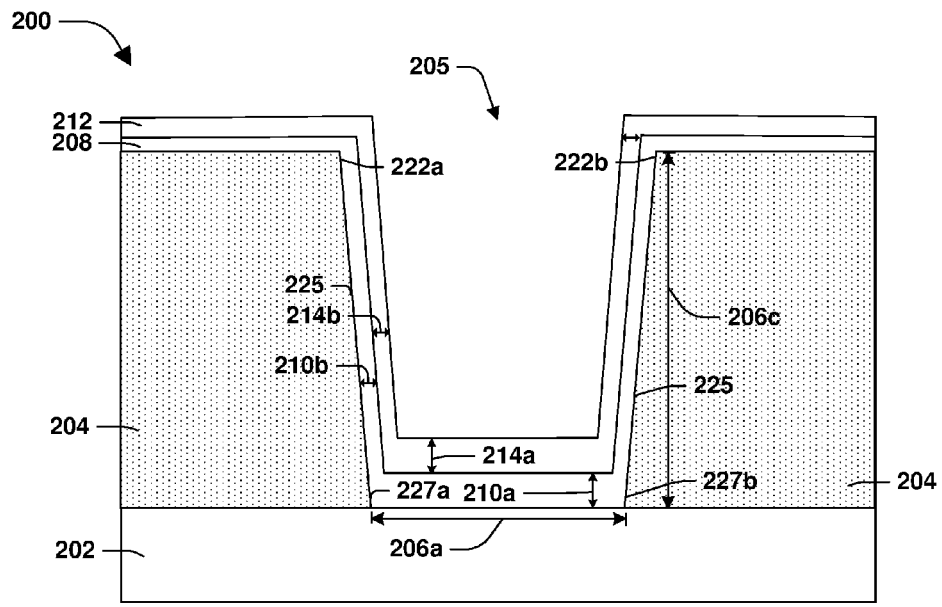
FIG. 4 is an illustration of a semiconductor device, in accordance with some embodiments.

At 104, the second metal layer 212 is formed in the first opening 205 over the first metal layer 208, as illustrated in FIG. 4, according to some embodiments. In some embodiments, the second metal layer 212 comprises at least one of nickel (Ni), titanium (Ti), cobalt (Co) or tungsten (W). In some embodiments, the second metal layer 212 has second bottom thickness 214a between about 5 Å to about 150 Å. In some embodiments, the second metal layer 212 has a second sidewall thickness 214b between about 2 Å to about 125 Å. In some embodiments, the second bottom thickness 214a is greater than the second sidewall thickness 214b. In some embodiments, the second metal layer 212 is formed using ALD.

Figure 5:
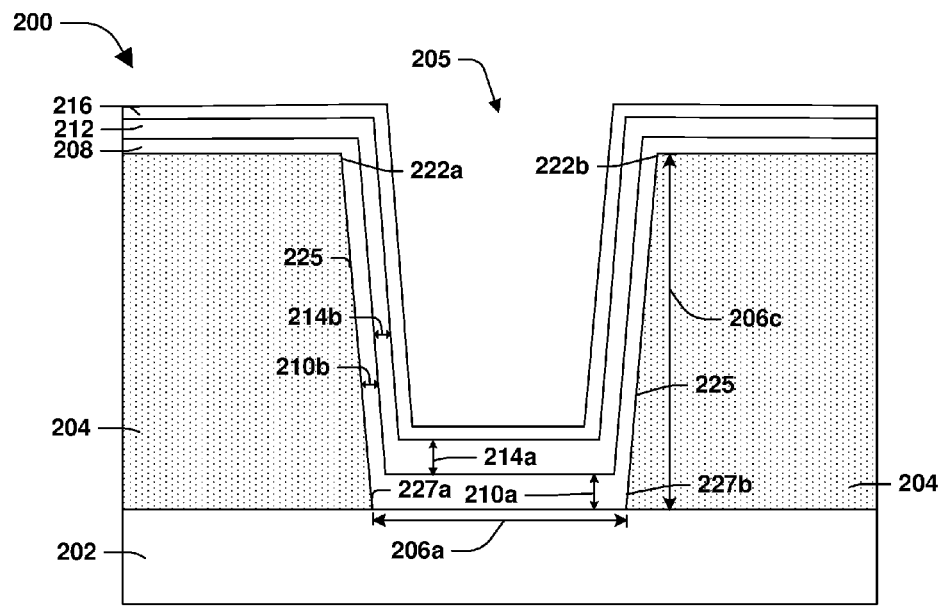
FIG. 5 is an illustration of a semiconductor device, in accordance with some embodiments.

At 106, the third metal layer 216 is formed over the second metal layer 212 in the first opening 205, as illustrated in FIG. 5, according to some embodiments. In some embodiments, the third metal layer 216 comprises at least one of titanium (Ti) or titanium nitride (TiN). In some embodiments, the third metal layer 216 has a third thickness between about 5 Å to about 100 Å. In some embodiments, the third metal layer 216 is formed by at least one of PVD, chemical vapor deposition (CVD) or ALD.

At 108, the anneal is performed on the semiconductor device 200 to form the metal oxide layer 220 from the first metal layer 208 and to form the silicide layer 218 over the metal oxide layer 220 from the second metal layer 212, as illustrated in FIG. 6. In some embodiments, the first metal layer 208, the second metal layer 212 and the substrate 202 are at least one of annealed at a first temperature between about 400° C. to about 800° C. or annealed for a first duration between about 5 s to about 2 hours. In some embodiments, the silicide layer 218 has a silicide thickness 226 between about 5 Å to about 150 Å. In some embodiments, the silicide layer 218 comprises silicon and at least one of nickel (Ni), titanium (Ti), cobalt (Co) or tungsten (W). In some embodiments, the silicon in the silicide layer 218 migrates from the silicon in the substrate 202. In some embodiments, the metal oxide layer 220 has a metal oxide thickness 224 between about 5 Å to about 100 Å. In some embodiments, the metal oxide layer 220 comprises at least one of zinc oxide (ZnO) or titanium oxide (TiO$_2$). In some embodiments, the metal oxide layer 220 comprises the oxygen gradient, such that the percentage of oxygen increases from the top surface 223a of the metal oxide layer 220 to the bottom surface 223b of the metal oxide layer 220. In some embodiments, residual portions of at least one of the first metal layer 208, the second metal layer 212 or the third metal layer 216 are removed, such as from a top surface of the dielectric layer 204 defining the first opening 205, as illustrated in FIG. 7. In some embodiments, at least one of the first metal layer 208, the second metal layer 212 or the third metal layer 216 are removed from the top surface by chemical mechanical planarization (CMP).

At 110, the metal plug 228 is formed in the first opening 205 over the third metal layer 216, as illustrated in FIG. 8, according to some embodiments. In some embodiments, the metal plug 228 comprises tungsten. In some embodiments, the metal plug 228 is formed by deposition. In some embodiments, the metal plug 228 is formed using at least one of PVD or CVD. In some embodiments, the metal plug 228 is formed in a chamber. In some embodiments, the metal plug 228 is formed using a tungsten precursor. In some embodiments, residual portions of metal plug 228, such as residual portions of the metal plug 228 above the top surface of the dielectric layer 204, are removed. In some embodiments, residual portions of metal plug 228 are removed from the top surface by CMP. In some embodiments, the Fermi level of the interface between the metal plug 228 and the substrate 202 is unpinned by the addition of the metal oxide layer 220, which is exhibited by a lowered SBH as compared to a semiconductor device that lacks such a metal oxide layer. In some embodiments, the metal oxide layer 220 increases oxygen vacancy states between the V.B. and the C.B. of the metal oxide layer 220, this decreases at least one of the intrinsic resistivity or the contact resistance between the metal plug 228 and the substrate 202, as compared to a semiconductor device that lacks such a metal oxide layer. In some embodiments, the silicide layer 218 formation reduces strain on the silicon lattice in the substrate 202, as compared to a semiconductor device that does not have such a silicide layer.

According to some embodiments, a semiconductor device comprises a metal plug in a first opening defined by a dielectric layer over a substrate. In some embodiments, the metal plug is over a metal oxide layer and a silicide layer is between the metal oxide layer and the metal plug.

According to some embodiments, a method of forming a semiconductor device comprises forming a first metal layer in a first opening defined by a dielectric layer over a substrate and forming a second metal layer in the first opening over the first metal layer. The method of forming a semiconductor device further comprises forming a third metal layer in the first opening over the second metal layer and annealing the semiconductor device to form a metal oxide layer from the first metal layer and to form a silicide layer over the metal oxide layer from the second metal layer. The method of forming a semiconductor device further comprises forming a metal plug in the first opening over the third metal layer.

According to some embodiments, a semiconductor device comprises a metal plug in a first opening defined by a dielectric layer over a substrate comprising silicon. In some embodiments, the metal plug is over a metal oxide layer comprising oxide and at least one of zinc or titanium and a silicide layer comprising silicon and at least one of titanium, nickel, tungsten, or cobalt, the silicide layer between the metal oxide layer and the metal plug.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers features, elements, etc. mentioned herein, such as etching techniques, implanting techniques, doping techniques, spin-on techniques, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method of forming a semiconductor structure comprising:
    forming a first metal layer in an opening defined by a dielectric layer over a substrate;
    forming a second metal layer in the opening over the first metal layer;
    forming a third metal layer in the opening over the second metal layer;
    annealing the semiconductor structure to form a metal oxide layer from the first metal layer and to form a silicide layer over the metal oxide layer from the second metal layer; and
    forming a metal plug in the opening over the third metal layer.

2. The method of claim 1, wherein forming the first metal layer comprises:
    depositing at least one of zinc, oxide, or titanium by at least one of atomic layer deposition or physical vapor deposition.

3. The method of claim 1, wherein forming the second metal layer comprises:
    depositing at least one of titanium, nickel, tungsten, or cobalt by atomic layer deposition.

4. The method of claim 1, wherein forming the third metal layer comprises:
    depositing at least one of titanium or nitrogen over the second metal layer.

5. The method of claim 1, wherein annealing the semiconductor structure comprises:
    exposing the semiconductor structure to a first temperature between about 400° C. to about 800° C. for a first duration between about 5 sec to about 2 hours.

6. The method of claim 1, comprising:
    etching the dielectric layer to define the opening.

7. The method of claim 6, wherein etching the dielectric layer comprises:
    performing a dry etch.

8. The method of claim 6, wherein etching the dielectric layer exposes a top surface of the substrate through the opening.

9. The method of claim 8, wherein forming the first metal layer comprises:

depositing the first metal layer over a top surface of the dielectric layer and over the top surface of the substrate to contact the top surface of the substrate.

10. The method of claim 1, wherein forming the first metal layer comprises:
depositing the first metal layer over a top surface of the dielectric layer, over a sidewall of the dielectric layer that defines the opening, and over a top surface of the substrate.

11. The method of claim 1, wherein forming the second metal layer comprises:
forming the second metal layer to contact the first metal layer.

12. The method of claim 11, wherein forming the third metal layer comprises:
forming the third metal layer to contact the second metal layer.

13. The method of claim 1, wherein annealing the semiconductor structure establishes an oxygen gradient within the metal oxide layer.

14. The method of claim 13, wherein a percentage of oxygen increases from a top surface of the metal oxide layer to a bottom surface of the metal oxide layer.

15. A method of forming a semiconductor structure comprising:
etching a dielectric layer to define an opening;
forming a first metal layer in the opening;
forming a second metal layer in the opening over the first metal layer;
annealing the semiconductor structure to form a metal oxide layer from the first metal layer and to form a silicide layer from the second metal layer; and forming a metal plug in the opening over the silicide layer and over the metal oxide layer.

16. The method of claim 15, comprising:
forming a third metal layer in the opening over the second metal layer prior to annealing the semiconductor structure.

17. The method of claim 15, wherein annealing the semiconductor structure establishes an oxygen gradient within the metal oxide layer.

18. The method of claim 15, wherein forming the first metal layer comprises:
performing a conformal deposition over the dielectric layer and in the opening.

19. The method of claim 15, wherein:
etching the dielectric layer exposes a top surface of a substrate through the opening, and
forming the first metal layer comprises forming the first metal layer to contact the top surface of the substrate.

20. A method of forming a semiconductor structure comprising:
forming a first metal layer in an opening defined by a dielectric layer and a substrate;
forming a second metal layer over the first metal layer;
annealing the semiconductor structure to form a metal oxide layer from the first metal layer and to form a silicide layer over the metal oxide layer from the second metal layer; and
forming a metal plug in the opening over the silicide layer.

* * * * *